(12) United States Patent
Arisa

(10) Patent No.: US 6,569,282 B1
(45) Date of Patent: May 27, 2003

(54) ETCHING APPARATUS

(75) Inventor: Shigeharu Arisa, Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 105 days.

(21) Appl. No.: 09/641,560

(22) Filed: Aug. 18, 2000

(30) Foreign Application Priority Data

Aug. 19, 1999 (JP) .......................................... 11-232190

(51) Int. Cl.$^7$ ................................................. C23F 1/00
(52) U.S. Cl. ........................... 156/345.21; 156/345.31; 156/345.51; 156/345.23
(58) Field of Search .......................... 156/345, 345.21, 156/345.31, 345.51, 345.23; 216/38; 438/716, 710, 758, 759

(56) References Cited

U.S. PATENT DOCUMENTS

| | | | | |
|---|---|---|---|---|
| 5,246,524 A | * | 9/1993 | Kuroda et al. | 156/345 |
| 5,474,647 A | * | 12/1995 | Poultney et al. | 156/626.1 |
| 5,590,445 A | * | 1/1997 | Lee | 26/51 |
| 5,672,239 A | * | 9/1997 | DeOrnellas | 156/625.1 |
| 5,891,298 A | * | 4/1999 | Kuroda et al. | 156/344 |
| 6,030,485 A | * | 2/2000 | Yamada | 156/344 |
| 6,149,758 A | * | 11/2000 | Tsujimoto et al. | 156/344 |
| 6,218,727 B1 | * | 4/2001 | Merkl et al. | 257/677 |
| 6,238,515 B1 | * | 5/2001 | Tsujimoto et al. | 156/379.8 |
| 6,239,038 B1 | * | 5/2001 | Wen | 438/745 |

FOREIGN PATENT DOCUMENTS

| | | |
|---|---|---|
| JP | 06-302572 | 10/1994 |
| JP | 09-223680 | 8/1997 |
| JP | 10-163135 | 6/1998 |
| JP | 11-176915 | 7/1999 |

* cited by examiner

*Primary Examiner*—Gregory Mills
*Assistant Examiner*—Karla Moore
(74) *Attorney, Agent, or Firm*—Nixon Peabody LLP; David S. Safran

(57) ABSTRACT

A wafer is supplied from a wafer cassette to an etching part by a wafer transport robot so as to be etched. After the etching process, a wafer frame is supplied from a wafer frame supply part to a mount part. The mount part to which the wafer frame is supplied moves to the upper part of a processing vessel of the etching part, and mounts the wafer at that position. After that, the mount part returns to its original position. A wafer frame collecting robot collects the wafer frame from the mount part that has returned to its original position, and stores the wafer frame in the wafer frame cassette.

12 Claims, 4 Drawing Sheets

ETCHING APPARATUS

BACKGROUND OF THE INVENTION

1. Field of the Invention

The present invention relates to an etching apparatus, more particularly to an etching apparatus which etches a wafer, of which reverse has been ground by a planarization apparatus, and then automatically mounts the wafer on a wafer frame for dicing.

2. Description of Related Art

Demands have been increasing to make thinner semiconductor elements because of the needs of the elements for IC cards. Then, after predetermined circuit patterns are formed on the obverse of a semiconductor wafer, the reverse of the wafer is ground by a planarization apparatus such as a back grinder so as to make a thin semiconductor wafer.

However, a fracture layer is formed on the reverse of the semiconductor wafer by the back grinding, and the fracture layer results in lower strength of the semiconductor wafer. In view of the disadvantage, the ground reverse of the semiconductor wafer is processed with an etching process in order to remove the fracture layer.

The semiconductor wafer that is etched after the back grinding as described above is mounted on a wafer frame after separating a protecting sheet, which is adhered for protecting the obverse of the wafer at back grinding. Then, the semiconductor wafer is supplied to a dicing machine while being mounted on the wafer frame, and the semiconductor wafer is diced into individual elements by the dicing machine.

In such a conventional method, the separation of the protecting sheet and the mounting of the wafer on the wafer frame are performed by an operator all manually. However, the semiconductor wafer that is made thin by etching is difficult to handle, and yield is lower.

SUMMARY OF THE INVENTION

The present invention has been developed in view of the above-described circumstances, and has as its object the provision of an etching apparatus that can automatically mount the etched wafer on the wafer frame.

In order to achieve the above-described objects, the present invention is directed to an etching apparatus, comprising: an etching part which holds an obverse of a wafer with a chuck by suction, the chuck being movable up and down and rotatable, then supplies etching liquid to a reverse of the wafer while rotating the wafer in a processing vessel so as to etch the reverse of the wafer, then jets a cleaning liquid to the reverse of the wafer while rotating the wafer so as to clean the reverse of the wafer, and then jets air to the reverse of the wafer while rotating the wafer so as to dry the reverse of the wafer; a wafer supply part which supplies the wafer to the etching part; a mount part which receives a wafer frame at a wafer frame receiving position, then moves relatively to an upper part of the processing vessel, then mounts the wafer on the wafer frame by adhering the reverse of the wafer that is transported to the upper part by the chuck to an adhesive sheet together with the wafer frame so as to mount the wafer on the wafer frame, and then returns to the wafer frame receiving position; a wafer frame supply part which supplies the wafer frame to the mount part which is positioned at the wafer frame receiving position; and a wafer frame collection part which collects the wafer frame from the mount part having returned at the wafer frame receiving position.

According to the present invention, the wafer is first supplied to the etching part by the wafer supply part. The obverse of the wafer, supplied to the etching part, is held by suction with the chuck which can move up and down and can rotate. Then, the wafer is rotated in the processing vessel while the etching liquid is supplied to the reverse of the wafer so as to etch the wafer. After the etching is completed, the wafer is again rotated in the processing vessel while the cleaning liquid is jetted to the reverse of the wafer so as to clean the wafer. Then, the cleaned wafer is still again rotated in the processing vessel while the air is supplied to the reverse of the wafer so as to dry the wafer. After the cleaning and the drying of the wafer are completed, the mount part which has received the wafer frame from the wafer frame supply part at the wafer frame receiving position moves to the upper part of the processing vessel. Then, the chuck moves up to the mount part which has moved to the upper part of the processing vessel, and the reverse of the wafer is adhered to the adhesive sheet together with the wafer frame, thereby the wafer is mounted on the wafer frame. The mount part that includes the wafer frame and the wafer mounted on the wafer frame returns to the wafer frame receiving position, and the wafer frame collecting part collects the wafer frame from the mount part that has returned to the wafer frame receiving position. By the process described above, the etched wafer can be mounted on the wafer frame in an automatic manner.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENT

Hereunder preferred embodiments of an etching apparatus of the present invention will be described in detail according to the accompanying drawings.

Figure 1:
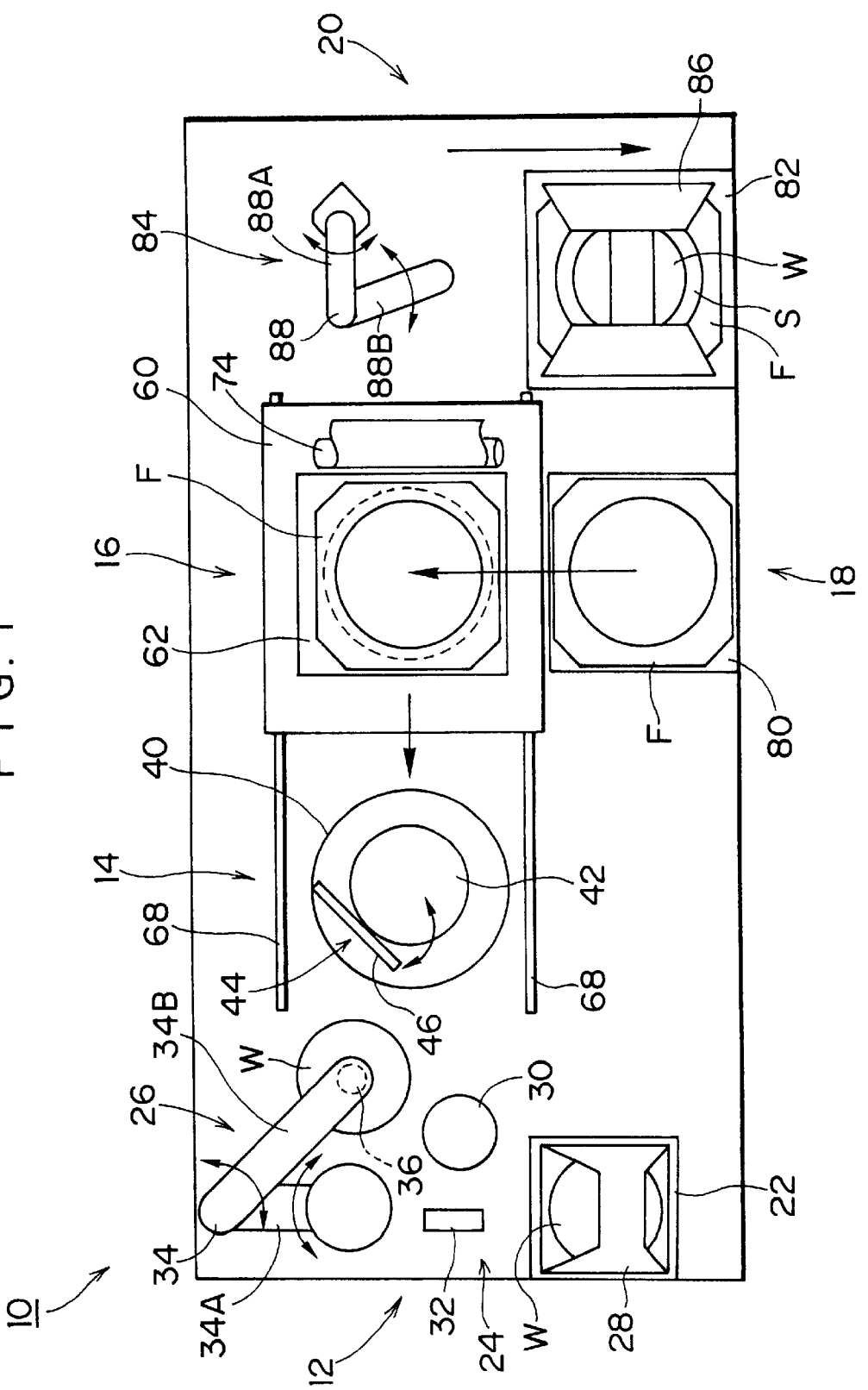
FIG. 1 is a plan view showing the entire construction of an etching apparatus according to the first embodiment of the present invention.

FIG. 1 is a plan view showing an entire construction of an etching apparatus according to the first embodiment of the present invention. As show in FIG. 1, the etching apparatus 10 comprises a wafer supply part 12, an etching part 14, a mount part 16, a wafer frame supply part 18, and a wafer frame collection part 20.

First, a construction of the wafer supply part 12 will be described. The wafer supply part 12 serves to supply a wafer W to be processed to the etching part 14. The wafer supply part 12 comprises a wafer cassette stage 22, an alignment device 24, and a wafer transport robot 26.

A wafer cassette 28 that stores a number of wafers W to be processed is set at the wafer cassette stage 22.

The alignment device 24 aligns the wafer W that is supplied to the etching part 14. The alignment device 24 comprises a measurement table 30 and an alignment sensor 32. The wafer W is held by suction to the measurement table 30 and is rotated, and the alignment sensor 32 detects an orientation flat or a position of a notch, which is formed on the wafer W, and the center of the wafer W. The wafer W is then aligned based on the results of the detection; more specifically, the measurement table 30 rotates such that the orientation flat or the notch is directed in a predetermined direction, and the wafer W is transported to the wafer transport robot 26 so that the center of the wafer W corresponds with the center of a chuck table 42 of the etching part 14.

The wafer transport robot 26 transports the wafer W from the wafer cassette 28 to the alignment device 24 and also transports the wafer W from the alignment device 24 to the etching part 14. The wafer transport robot is a common industrial robot, which comprises an arm 34 and a suction pad 36, which is provided at the end of the arm 34. The arm 34 comprises a first arm 34A and a second arm 34B. The first arm 34A can swivel around the base part and move up and down. The suction pad 36 is rotatably provided to the end of the second arm 34B, and the wafer W is held by the suction pad 36 and transported.

At the wafer supply part 12, which is constructed as described above, the wafer transport robot 26 picks up the wafer W from the Wafer cassette 28, which is set at the wafer cassette stage 22, and transports the wafer W to the alignment device 24. The wafer W is aligned by the alignment device 24 and is supplied to the etching part 14.

Figure 2:
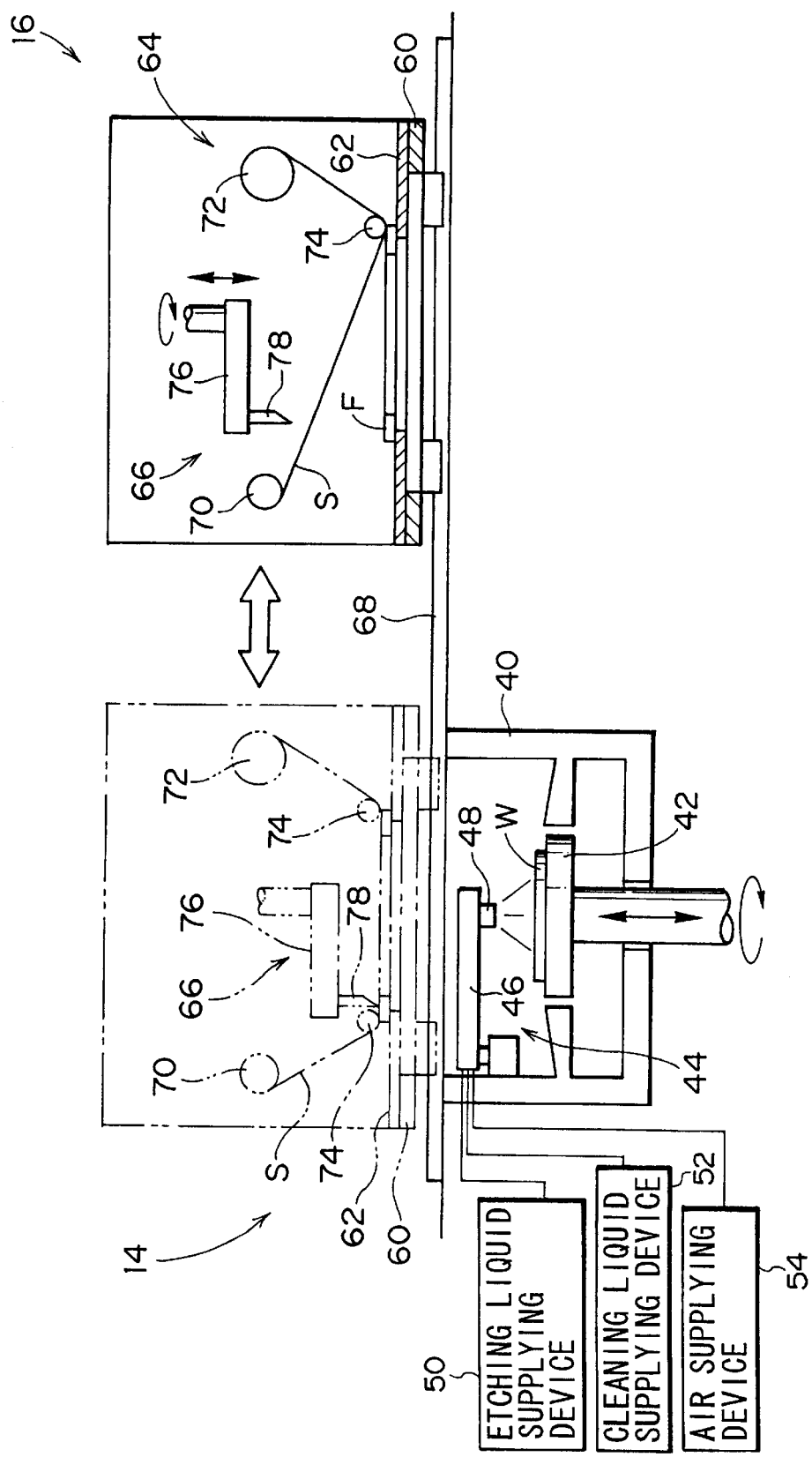
FIG. 2 is a side view showing a construction of an etching part and a mount part in the etching apparatus in FIG. 2.

The construction of the etching part 14 shown in FIG. 2 is described. The etching part 14 etches the reverse of the wafer W (opposite of the obverse, on which a circuit pattern is formed). The etching part 14 comprises a processing vessel 40, the chuck table 42, and a supply apparatus 44.

The processing vessel 40 is formed in a cylindrical shape, and the chuck table 42 is arranged in the processing vessel 40. The chuck table 42 is formed like a disk, and serves to hold the obverse of the wafer W (the face on which the circuit pattern is formed) by suction. The chuck table 42 is rotated by a rotation means (not shown), and is also driven by an elevation means (not shown) to move up and down. The supply apparatus 44 comprises an arm 46 and a nozzle 48, which is provided at the end of the arm 46. The arm 46 is driven by a swivel means (not shown) and swivels so as to position the nozzle 48 at a supply position, which is the upper position of the chuck table 42 as shown in FIG. 2, and a stand-by position, where the arm 46 retreats from the upper part of the chuck table 42 as shown in FIG. 1, and further swivels between the supply position and the stand-by position. A etching liquid supplying device 50, a cleaning liquid supplying device 52, and an air supplying device 54 are connected to the nozzle 48 through pipes, and they are constructed to selectively supply one of etching liquid, cleaning liquid and air to the nozzle 48.

In the etching part 14, which is constructed as described above, the wafer W is etched by the process presented below.

The wafer W that is transported from the alignment device 24 to the etching part 14 by the wafer transport robot 26 is placed on the chuck table 42, which is positioned at a predetermined wafer receiving position. At this point, the wafer W is placed on the chuck table 42 so that the obverse of the wafer W is turned down, and the orientation flat or the notch is directed in the predetermined direction.

As the wafer W is placed on the chuck table 42, the chuck table 42 holds the wafer W by suction, and the chuck table 42 descends by a predetermined amount and positions at a predetermined etching position (the position in FIG. 2).

When the chuck table 42 positions at the etching position, the arm 46 swivels so that the nozzle 48 moves from the stand-by position to the supply position while swinging between the stand-by position and the supply position. The etching liquid supplying device 50 and the rotation drive means are then driven, whereby the etching liquid is evenly supplied from the nozzle 48 to the reverse of the rotating wafer W while the arm 46 swings, so that the reverse of the wafer W is etched.

As the predetermined time has passed after starting supplying of the etching liquid, the driving of the etching liquid supplying device 50 is stopped. The cleaning liquid supplying device 52 is then driven, whereby the cleaning liquid is jetted from the nozzle 48 to the reverse of the rotating wafer W, so that the reverse of the etched wafer W is cleaned.

As the predetermined time has passed after starting jetting of the cleaning liquid, the driving of the cleaning liquid supplying device 52 is stopped. The air supplying device 54 is then driven, whereby the air is jetted from the nozzle 48 to the reverse of the rotating wafer W, so that the reverse of the cleaned wafer W is dried.

As the predetermined time has passed after starting jetting of the air, the driving of the air supplying device 54 is stopped. The arm 46 is then swiveled to return the nozzle 48 to the stand-by position, and the driving of the rotation drive means is stopped to stop the rotation of the chuck table 42. The chuck table 42 stops at the position where the orientation flat or the notch, which is detected by the rotation position detector (not shown), is directed in the predetermined direction. By the above-described process, the etching of the wafer W is completed.

A construction of the mount part 16 will next be described. The mount part 16 serves to mount the etched wafer W on a wafer frame F for dicing. More specifically, the mount part 16 mounts the wafer W on the wafer frame F for dicing through a wafer sheet S. The mount part 16 comprises a moving body 60, a holder 62, a wafer sheet adhering device 64 and a wafer sheet cutting device 66.

The moving body 60 is slidably provided on guide rails 68, and is driven by a moving device (not shown) (e.g. a leading screw mechanism or a cylinder) so as to move along the guide rails 68. The moving body 60 reciprocally moves between the predetermined wafer frame receiving position and the mounting position, which is s et at the part of the processing vessel 40. The holder 62 is provided on the moving body 60, and holds the wafer frame F.

The wafer sheet adhering device 64 and the wafer sheet cutting device 66 are provided on the moving body 60. As shown in FIG. 2, the wafer sheet adhering device 64 comprises a wafer sheet supply roller 70, around which a strip wafer sheet S is wound, a wafer sheet wind-up roller 72 for winding up the wafer sheet S that is fed from the wafer sheet supply roller 70, and a wafer sheet pressing roller 74 for pressing the wafer sheet S against the top faces of the wafer W and the wafer frame F so as to adhere the wafer sheet S. The wafer sheet cutting device 66 comprises a cutting arm 76, which can rotate as w ell as move up and down, and a cutting blade 78, which is provided at the end of the cutting arm 76.

In the mount part 16, which is constructed as described above, the wafer W is mounted on the wafer frame F by the following process.

When the etching process for the wafer W is completed at the etching part 4, the wafer frame F is supplied from the wafer frame supply part 18, which will be described later, to the mount part 16, which is positioned at the wafer frame receiving position, and the wafer frame F is placed on the holder 62.

As the wafer frame F is placed on the holder 62, the moving body 60 moves to the mounting position. At this state, the wafer frame F that is held by the holder 62 corresponds with the center of the wafer held on the chuck table 42.

Then, the chuck table 42 ascends and moves to a predetermined adhering position. At this state, the reverse of the wafer W (to face) is flush with the top face of the wafer frame F.

Next, the wafer sheet pressing roller 74 descends by the predetermined amount and presses the wafer sheet S against the wafer frame F. The wafer sheet pressing roller 74 then moves along the top face of the wafer frame F so as to adhere the wafer sheet S on the top faces of the wafer W and the wafer frame F.

After that the cutting arm 76 descends by the predetermined amount and presses the edge of the cutting blade 78 against the top face of the wafer frame F, then rotates, whereby an extra portion of the outer periphery of the wafer sheet S that is adhered to the wafer frame F is cut out by the cutting blade 78.

After the wafer sheet S is cut out, the cutting arm 76 ascends by the predetermined amount, and the wafer sheet pressing roller 74 returns to its original position. Then, the wafer sheet wind-up roller 72 is driven so that the extra portion of the wafer sheet S that is cut out is wound up by the wafer sheet wind-up roller 72. The chuck table 42 releases the wafer W from the suction and descends by the predetermined amount so as to move to the predetermined stand-by position.

The mounting process for the wafer W is completed through the above-described process. After the completion of the mounting process, the moving body 60 returns to the wafer frame receiving position.

The construction of the wafer frame supply part 18 will be described. The wafer frame supply part 18 supplies the wafer frame F to the holder 62 of the mount part 16 that is positioned at the wafer frame receiving position. The wafer frame supply part 18 comprises a wafer frame stocker 80 and a wafer frame supply robot (not shown). The wafer frame stocker 80 contains wafer frames F in piled state, and the wafer frame supply robot transports the wafer frames F onto the holder 62 of the mount part 16 that is positioned at the wafer frame receiving position.

Directed to the description of the construction of the wafer frame collecting part 20, the wafer frame collecting part 20 serves to collect the wafer frames F from the holder 62 of the mount part 16 that has returned to the wafer frame receiving position after mounting the wafer W. The wafer frame collecting part 20 comprises a wafer frame cassette stage 82 and a wafer frame collecting robot 84.

In the wafer frame cassette stage 82, a wafer frame cassette 86 is set in which number of the wafer frames F on that the wafers W are mounted can be stored.

The wafer frame collecting robot 84 picks up the wafer frame F from the holder 62 of the mount part 16 that has returned to the wafer frame receiving position, and stores the wafer frame F in the wafer frame cassette 86 that is set on the wafer frame cassette stage 82. The wafer frame collecting robot 84 is a common industrial robot, which comprises an arm 88 and a damper (not shown), which is provided at the end of the arm 88. The arm 88 comprises a first arm 88A and a second arm 88B. The first arm 88A can swivel around the base part and move up and down. The second arm 88B is provided at the end of the first arm 88A. The damper is provided at the end of the second arm 88B, and the wafer frame F is grasped by the damper and transported.

An operation of the etching apparatus 10 in the first embodiment, which is constructed as described above, is as follows.

First, the operator sets the wafer cassette 28 that stores a number of wafers W to be etched on the wafer cassette stage 22. The wafer frame F is set next in the wafer frame stocker 80. Then, the operator sets the empty wafer frame cassette 86 on the wafer frame cassette stage 82. After the above settings are completed, the etching apparatus 10 is activated.

The wafer transport robot 26 first picks up the wafer W from the wafer cassette 28, and transports the picked-up wafer W onto the measurement table 30 of the alignment device 24. The alignment device 24 aligns the transported wafer W, and after completion of the aligning, the wafer transport robot 26 picks up the wafer W from the measurement table 30 and transports then to the etching part 14.

The wafer W that is transported to the etching part 14 by the wafer transport robot 26 is placed on the chuck table 42 that positions at the predetermined wafer receiving position. At this point, the wafer W is placed on the chuck table 42 so that the obverse of the wafer is turned down and the orientation flat or the notch is directed in the predetermined direction.

When the wafer W is placed on the chuck table 42, the chuck table 42 holds the wafer W by suction, and descends by the predetermined amount so as to position at the etching position.

When the chuck table 42 is positioned at the etching position, the etching process starts. First, the arm 46 swivels so that the nozzle 48 swings from the stand-by position to the supply position. Then, the etching liquid supplying device 50 is driven and the etching liquid is supplied to the wafer W on the chuck table 42. At the same time, the rotation drive means is driven so that the chuck table 42 rotates. Thus, the etching liquid is jetted to the reverse (now the top face) of the rotating wafer W and the reverse of the wafer W is etched. After the completion of the etching, the driving of the etching liquid supplying device 50 is stopped, and the cleaning liquid supplying device 52 is driven, whereby the cleaning liquid is jetted from the nozzle 48 to the reverse of the rotating wafer W and the reverse of the etched wafer W is cleaned. After the completion of the cleaning, the driving of the cleaning liquid supplying device 52 is stopped, and the air supplying device 54 is driven next, whereby the air is jetted from the nozzle 48 to the rotating wafer W and the reverse of the cleaned wafer W is dried. After the drying is completed, the driving of the air supplying device 54 is stopped. After the driving of the air supplying device 54 is stopped, the arm 46 swivels so that the nozzle 48 returns to the stand-by position. At the same time, the driving of the rotation drive means is stopped so as to stop the rotation of the chuck table 42. By the above-described process, the etching process is completed.

After the completion of the etching process, the wafer frame supply robot (not shown) of the wafer frame supply part 18 picks up the wafer frame F from the wafer frame stocker 80, and places the wafer frame F on the holder 62 of the mount part 16 that is positioned at the wafer frame receiving position. Then, the moving body 60 moves to the mounting position as shown with an alternate long and two short dashes line in FIG. 2, that is, the upper part of the processing vessel 40.

When the moving body 60 moves to the mounting position, the chuck table 42 ascends to the predetermined adhering position. Thereby, the reverse of the wafer W (now the top face) becomes flush with the top face of the wafer frame F. The wafer sheet S is then adhered to the top faces of the wafer W and the wafer frame F. More specifically, the wafer sheet pressing roller 74 descends by the predetermined amount and presses the wafer sheet S against the wafer frame F, and further moves along the top face of the wafer frame F so as to adhere the wafer sheet S to the top faces of the wafer W and the wafer frame F. After adhering the wafer sheet S, the cutting arm 76 descends by the predetermined amount and rotates, whereby the extra outer periphery of the wafer sheet S that is adhered to the wafer frame F is cut out by the cutting blade 78, which is provided at the end of the cutting arm 76. After that, the cutting arm 76 ascends by the predetermined amount and returns to its original position. The wafer sheet pressing roller 74 as well returns to its original position and the extra wafer sheet S that is cut out is wound up by the wafer sheet wind-up roller 72. The chuck table 42, on the other hand, releases the wafer W from the suction, and descends by the predetermined amount so as to return at the predetermined stand-by position. Thus, the wafer W is mounted on the wafer frame F.

When the wafer W is mounted on the wafer frame F, the moving body 60 returns to the wafer frame receiving position. The wafer frame collecting robot 84 picks up the wafer frame F from the holder 62 of the mount part 16 that has returned to the wafer frame receiving position, and stores the wafer frame F in the wafer frame cassette 86 that is set on the wafer frame cassette stage 82.

The process for one wafer W is completed through the above-described process. Wafers W that are stored in the wafer cassette 28 are sequentially processed in an order by the same process.

As described above, in the etching apparatus 10 in the present embodiment, the wafer W stored in the wafer cassette 28 is etched, mounted on the wafer frame F, and is stored in the wafer frame cassette 86, all in an automatic manner. Thus, the processing efficiency can be dramatically improved. In view of handling, the etched wafer is extremely thin and is extremely difficult to handle; however, the wafer W is mounted on the wafer frame F at the etching part 14 in the present invention, so that the handling can be easily performed and the yield can be improve as a result.

Figure 3:
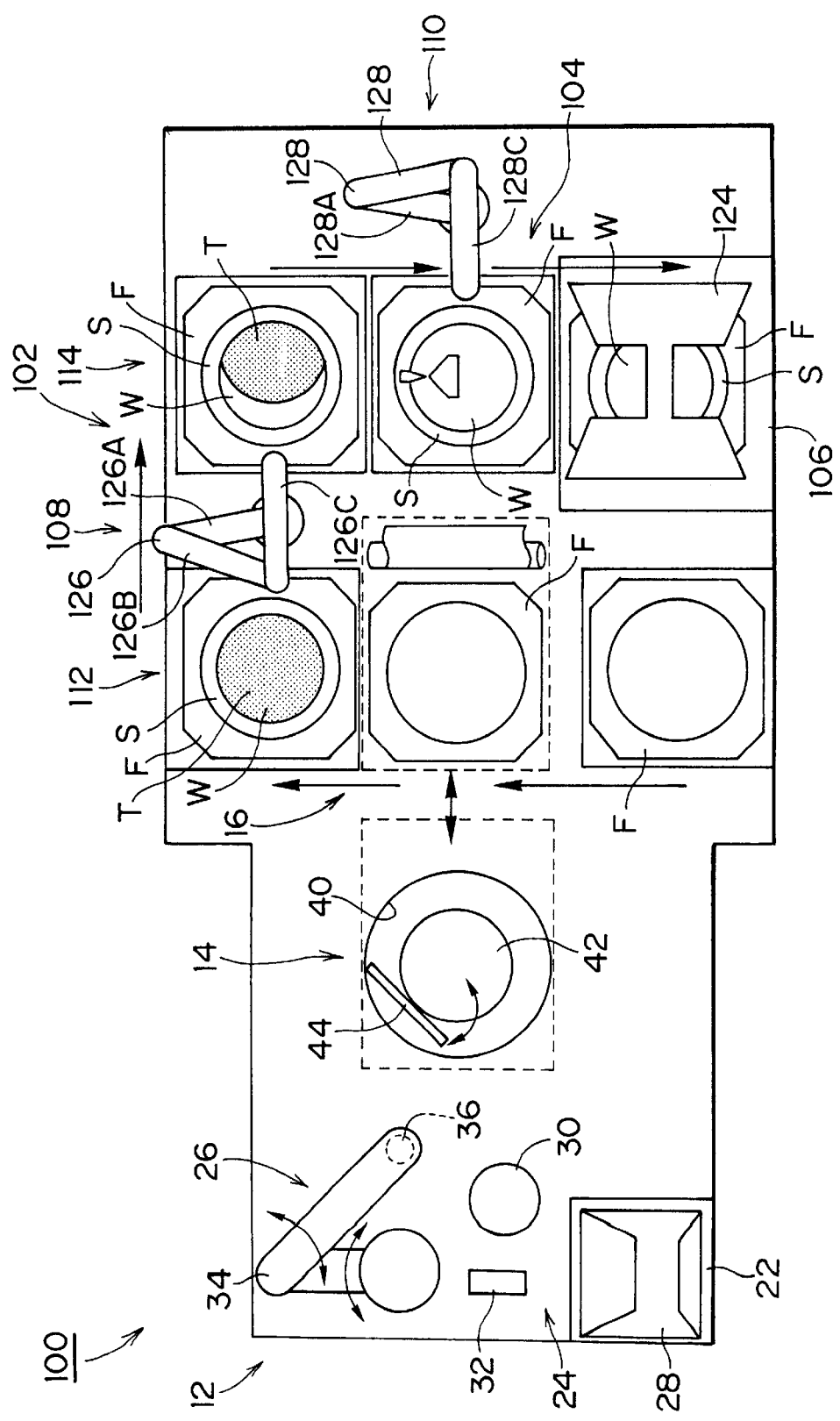
FIG. 3 is a plan view showing the entire construction of an etching apparatus according to the second embodiment of the present invention.

FIG. 3 is a plan view showing an entire construction an etching apparatus according to the second embodiment of the present invention.

In the above-described first embodiment, the etching apparatus 10 stores the wafer F in the wafer frame cassette 86 just after mounting the wafer W on the wafer frame F. However, the protecting sheet T is adhered to the obverse of etched wafer W, and the protecting sheet T must be separated from the wafer W before the next dicing process. The etching apparatus 100 in the second embodiment stores the wafer W mounted on the wafer frame F in the wafer frame cassette after removing the protecting sheet T from the wafer W and cleaning the wafer W.

Other constructions than the wafer frame collecting part are the same as the ones mentioned with regard to the etching apparatus 10 in the first embodiment; thus the description hereunder will be given to the construction of the wafer frame collecting part only, and the members which are the same as the ones of the etching apparatus 10 in the first embodiment will be assigned the same reference numbers and characters and the description on them will be omitted.

The collecting part of the etching apparatus 100 in the second embodiment comprises a protecting sheet separation device 102, a cleaning device 104, a wafer frame stage 106, a first wafer frame transport robot 108, and a second wafer frame transport robot 110.

Figure 4:
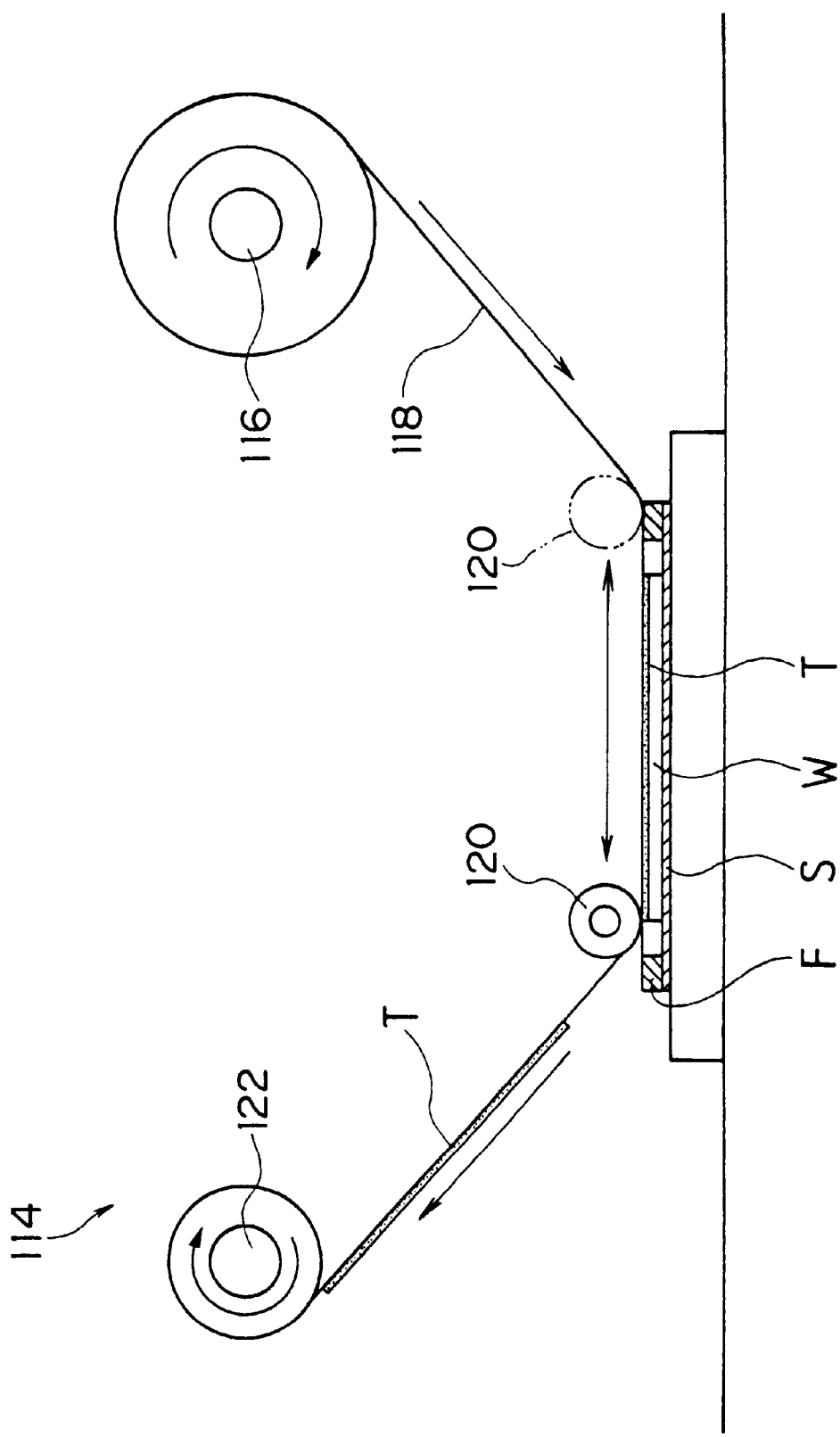
FIG. 4 is a side view showing the construction of a protecting sheet separation unit in the etching apparatus in FIG. 3.

The protecting sheet separation device 102 separates the protecting sheet T from the obverse of the wafer W that is mounted on the wafer frame F. The protecting sheet separation device 102 comprises a ultraviolet (UV) irradiation unit 112 and a protecting sheet separation unit 114. When the wafer W is transported to a predetermined UV irradiation position, the obverse of the wafer W is dried by blowing air, and then the UV-irradiation unit 12 irradiates the obverse of the wafer W with UV light. At this point, adhesive of the protecting sheet T, which is adhered to the obverse of the wafer W, is hardened by irradiation of UV light. Thereby, the protecting sheet T can be easily removed from the obverse of the wafer W. The protecting sheet separation unit 114 removes the protecting sheet T that is adhered to the obverse of the wafer W. As shown in FIG. 4, the protecting sheet separation unit 114 adheres an adhesion tape 118, which is fed from an adhesion tape supply roller 116 with the adhering face turned down, onto the protecting sheet T over the obverse of the wafer W by an adhesion tape pressing roller 120. Then, an adhesion tape wind-up roller 122 winds up the adhesion tape 118 along with the protecting sheet T, so that the protecting sheet T is removed from the obverse of the wafer W.

The cleaning device 104 cleans by jet scrubbing the obverse of the wafer W from which the protecting sheet T is removed. More specifically, the wafer W is held on a turn table, which is disposed in a cleaning vessel, and the cleaning liquid is jetted to the wafer while rotating the wafer W so as to rinse the wafer W. Then, a rotating brush is pressed against the obverse of the rotating wafer W so as to clean the wafer W by scrubbing, and after that, the cleaning liquid is jetted in a low pressure while still rotating the wafer W so as to clean the wafer W by the low-pressurized jet cleaning. Thereafter, the cleaning liquid is jetted so as to rinse the wafer W while rotating the wafer W, and the air is at last jetted to the still rotating wafer W so as to dry the wafer by spin drying.

On the wafer frame stage 106, a wafer frame cassette 124 is set, which can store a number of wafer frames F on which the wafers W are mounted.

The first wafer frame transport robot 108 picks up the wafer frame F from the holder 62 of the mount part 16 that is positioned at the wafer frame receiving position, and turns the wafer frame F upside down, then transports the wafer frame F to the UV irradiation unit 112. The first wafer frame transport robot 108 also transports the wafer frame F from the UV irradiation unit 112 to the protecting sheet separation unit 114. The first wafer frame transport robot 108 is a common industrial robot, which comprises an arm 126 and a damper (not shown), which is provided to the end of the arm 126. The arm 126 comprises a first arm 126A, a second arm 126B, and a third arm 126C. The first arm 126A can swivel around the base part and move up and down. The second arm 126B is provided to the end of the first arm 126A to be able to swivel, and the third arm 126C is provided to the end of the arm 126B to be able to swivel. The damper is provided to the end of the third arm 126C to be rotatable around the axis of the third arm 126C. The wafer frame F is clamped by the damper and is transported. The wafer frame F is turned upside down by rotating the damper by the half amount around the axis of the third arm 126C.

The second wafer frame transport robot 110 transports the wafer frame F from the protecting sheet separation unit 114 to the cleaning device 104 as well as collecting the wafer frame F from the cleaning device 104, and stores the wafer frame F in the wafer frame cassette 124 that is set on the wafer frame stage 106. The second wafer frame transport robot 110 is another common industrial robot, which is the same as the first wafer frame transport robot 108 and comprises an arm 128 and a damper (not shown), which is provided to the end of the arm 128. The arm 128 comprises a first arm 128A, a second arm 128B, and a third arm 128C. The first arm 128A can swivel around the base part and move up and down. The second arm 128B is provided to the end of the first arm 128A to be able to swivel, and the third arm 128C is provided to the end of the second arm 18B to be able to swivel. The clamper is provided to the end of the third arm 128C, and the wafer frame F is clamped by the damper and is transported.

An operation of the etching apparatus in the second embodiment, which is constructed as described above, is as follows. The process up to the mounting process is the same as the one in the etching apparatus 10 described in the first embodiment, thus a process after the mounting will be described.

When the wafer W is mounted on the wafer frame F and the mount part 16 returns to the wafer frame receiving position, the first wafer frame transport robot 108 picks up the wafer frame F from the holder 62 of the mount part 16. Then, the wafer frame F is turned upside down, and is transported to the UV irradiation position in the UV irradiation unit 112.

When the wafer frame F is transported to the UV irradiation position, the UV irradiation unit 112 first blows the air to dry the obverse of the wafer W, then irradiates the obverse of the wafer W with UV light. After the irradiating is completed, the first wafer frame transport robot 108 transports the wafer frame F to the protecting sheet separation unit 114. The protecting sheet separation unit 114 removes the protecting sheet T from the obverse of the wafer W that is mounted on the transported wafer frame F.

As the protecting sheet T is removed from the obverse of the wafer W, the second wafer frame transport robot 110 transports the wafer frame F to the cleaning device 104, which cleans the obverse of the wafer W that is mounted on the transported wafer frame F by the jet scrubbing.

When the cleaning is completed and the wafer W is dried, the second wafer frame transport robot 110 collects the wafer frame F from the cleaning device 104, and stores the wafer frame F in the wafer frame cassette 124 that is set on the wafer frame stage 106.

As described above, in the etching apparatus 100 in the present embodiment, the etched wafer W is mounted on the wafer frame F and the protecting sheet T is removed from the obverse of the wafer W, then the wafer W is stored in the wafer frame cassette 124. Thereby, the protecting sheet T does not have to be removed by an additional process and by an additional apparatus after mounting the wafer W on the wafer frame F, and hence the processing efficiency can be further improved.

Moreover, in the etching apparatus 100 in the present embodiment, the obverse of the wafer W is cleaned by the cleaning device 104 after removing the protecting sheet T; thus the contamination on the pattern face can be eliminated. The etching apparatus may be constructed in a manner to store the wafer W in the wafer frame cassette 124 just after removing the protecting sheet T without the cleaning device 104.

In the present embodiment, the transporting of the wafer frame F from the mount part 16 to the UV irradiation unit 112 and the transporting of the wafer frame F from the UV irradiation unit 112 to the protecting sheet separation unit 114 are both performed by the first wafer frame transport robot 108, but may also be performed by two transport robots provided individually. Further, the transporting of the wafer frame F from the protecting sheet separation unit 114 to the cleaning device 104 and the transporting of the wafer frame F from the cleaning device 104 to the wafer frame cassette 124 are both performed by the second wafer frame transport robot 110, but may also be performed by two transporting robots provided individually. Other trans port means instead of the transport robots may be used.

As has been described hereinabove, according to the present invention, the wafer is etched and the etched wafer is mounted on the wafer frame all in an automatic manner. Therefore, the present invention can handle the extremely thin wafer more safely and can improve the yield while the processing efficiency is dramatically improved.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. An etching apparatus, comprising:
   an etching part comprising:
      a processing vessel;
      a chuck for holding an obverse of a wafer by suction, the chuck being movable up and down and rotatable in the processing vessel;
      an etching liquid supplying device for supplying etching liquid to a reverse of the wafer during rotation of the wafer by the chuck in the processing vessel so as to etch the reverse of the wafer;
      a cleaning liquid jetting device for directing cleaning liquid to the reverse of the wafer during rotation of the wafer by the chuck so as to clean the reverse of the wafer after it has been etched; and
      an air jetting device for directing air to the reverse of the wafer during rotation of the wafer by the chuck so as to dry the reverse of the wafer after it has been cleaned;
   a wafer supply part for supplying the wafer to the etching part;
   a mount part adapted to receive a wafer frame at a wafer frame receiving position, to move the wafer frame to an upper part of the processing vessel, to mount the wafer on the wafer frame by adhering the reverse of the wafer to an adhesive sheet together with the wafer frame by bringing the chuck to an adhering position at which the reverse of the wafer is flush with a top face of the wafer frame with the obverse of the wafer held by the chuck, and to return to the wafer frame receiving position;
   a wafer frame supply part for supplying the wafer frame to the mount part at the wafer frame receiving position; and
   a wafer frame collection part for collecting the wafer frame from the mount part at the wafer frame receiving position.

2. The etching apparatus as defined in claim 1, wherein the wafer frame collection part comprises:
   a wafer frame cassette stage having a wafer frame cassette located thereat, a plurality of wafer frames being stored in the wafer frame cassette; and
   a wafer frame transporting device for collecting the wafer frame from the mount part at the wafer frame receiving position and for storing the wafer frame in the wafer frame cassette at the wafer frame cassette stage.

3. The etching apparatus as defined in claim 1, wherein the wafer frame collection part comprises:
- a protecting sheet separation device for removing a protecting sheet from the obverse of the wafer mounted on the wafer frame;
- a wafer frame cassette stage having a wafer frame cassette located thereat, a plurality of wafer frames being stored in the wafer frame cassette;
- a first wafer frame transporting device for collecting the wafer frame from the mount part at the wafer frame receiving position and for transporting the wafer frame to the protecting sheet separation device; and
- a second wafer frame transporting device for delivering the wafer frame from the protecting sheet separation device to the wafer frame cassette at the wafer frame cassette stage after the protecting sheet has been removed from the wafer by the protecting sheet separation device.

4. The etching apparatus as defined in claim 1, wherein the wafer frame collection part comprises:
- a protecting sheet separation device for removing a protecting sheet from the obverse of the wafer mounted on the wafer frame;
- a wafer cleaning device for cleaning the obverse of the wafer from which the protecting sheet has been removed;
- a wafer frame cassette stage having a wafer frame cassette located thereat, a plurality of wafer frames being stored in the wafer frame cassette;
- a first wafer frame transporting device for collecting the wafer frame from the mount part at the wafer frame receiving position and for transporting the wafer frame to the protecting sheet separation device;
- a second wafer frame transporting device for transporting the wafer frame to the wafer cleaning device after the protecting sheet has been removed from the wafer by the protecting sheet separation device; and
- a third wafer frame transporting device for delivering the wafer frame from the wafer cleaning device to the wafer frame cassette at the wafer frame cassette stage after the obverse of the wafer has been cleaned by the wafer cleaning device.

5. The etching apparatus as defined in claim 1, wherein the wafer supply part comprises:
- a wafer cassette stage having a wafer cassette located thereat, a plurality of wafers being stored in the wafer cassette; and
- a wafer transporting device for picking up the wafer from the wafer cassette at the wafer cassette stage and for supplying the wafer to the etching part.

6. The etching apparatus as defined in claim 5, wherein the wafer frame collection part comprises:
- a wafer frame cassette stage having a wafer frame cassette located thereat, a plurality of wafer frames being stored in the wafer frame cassette; and
- a wafer frame transporting device for collecting the wafer frame from the mount part at the wafer frame receiving position and for storing the wafer frame in the wafer frame cassette at the wafer frame cassette stage.

7. The etching apparatus as defined in claim 5, wherein the wafer frame collection part comprises:
- a protecting sheet separation device for removing a protecting sheet from the obverse of the wafer mounted on the wafer frame;
- a wafer frame cassette stage having a wafer frame cassette located thereat, a plurality of wafer frames being stored in the wafer frame cassette;
- a first wafer frame transporting device for collecting the wafer frame from the mount part at the wafer frame receiving position and for transporting the wafer frame to the protecting sheet separation device; and
- a second wafer frame transporting device for delivering the wafer frame from the protecting sheet separation device to the wafer frame cassette at the wafer frame cassette stage after the protecting sheet has been removed from the wafer by the protecting sheet separation device.

8. The etching apparatus as defined in claim 5, wherein the wafer frame collection part comprises:
- a protecting sheet separation device for removing a protecting sheet from the obverse of the wafer mounted on the wafer frame;
- a wafer cleaning device for cleaning the obverse of the wafer from which the protecting sheet has been removed;
- a wafer frame cassette stage having a wafer frame cassette located thereat, a plurality of wafer frames being stored in the wafer frame cassette;
- a first wafer frame transporting device for collecting the wafer frame from the mount part at the wafer frame receiving position and for transporting the wafer frame to the protecting sheet separation device;
- a second wafer frame transporting device for transporting the wafer frame to the wafer cleaning device after the protecting sheet has been removed from the wafer by the protecting sheet separation device; and
- a third wafer frame transporting device for delivering the wafer frame from the wafer cleaning device to the wafer frame cassette at the wafer frame cassette stage after the obverse of the wafer has been cleaned by the wafer cleaning device.

9. The etching apparatus as defined in claim 5, wherein:
- the wafer supply part further comprises an alignment device for aligning the wafer; and
- the wafer transporting device transports the wafer from the wafer cassette to the alignment device and supplies the wafer from the alignment device to the etching part after the wafer has been aligned by the alignment device.

10. The etching apparatus as defined in claim 9, wherein the wafer frame collection part comprises:
- a wafer frame cassette stage having a wafer frame cassette located thereat, a plurality of wafer frames being stored in the wafer frame cassette; and
- a wafer frame transporting device for collecting the wafer frame from the mount part at the wafer frame receiving position and for storing the wafer frame in the wafer frame cassette at the wafer frame cassette stage.

11. The etching apparatus as defined in claim 9, wherein the wafer frame collection part comprises:
- a protecting sheet separation device for removing a protecting sheet from the obverse of the wafer mounted on the wafer frame;
- a wafer frame cassette stage having a wafer frame cassette located thereat, a plurality of wafer frames being stored in the wafer frame cassette;
- a first wafer frame transporting device for collecting the wafer frame from the mount part at the wafer frame receiving position and for transporting the wafer frame to the protecting sheet separation device; and a second wafer frame transporting device for delivering the wafer frame from the protecting sheet separation device to the wafer frame cassette at the wafer frame cassette stage after the protecting sheet has been removed from the wafers by the protecting sheet separation device.

12. The etching apparatus as defined in claim 9, wherein the wafer frame collection part comprises:

a protecting sheet separation device for removing a protecting sheet from the obverse of the wafer mounted on the wafer frame;

a wafer cleaning device for cleaning the obverse of the wafer from which the protecting sheet has been removed;

a wafer frame cassette stage having a wafer frame cassette located thereat, a plurality of wafer frames being stored in the wafer frame cassette;

a first wafer frame transporting device for collecting the wafer frame from the mount part at the wafer frame receiving position and for transporting the wafer frame to the protecting sheet separation device;

a second wafer frame transporting device for transporting the wafer frame to the wafer cleaning device after the protecting sheet has been removed from the wafer by the protecting sheet separation device; and a third wafer frame transporting device for delivering the wafer frame from the wafer cleaning device to the wafer frame cassette at the wafer frame cassette stage after the obverse of the wafer has been cleaned by the wafer cleaning device.

* * * * *